United States Patent
Pai

(10) Patent No.: US 7,362,252 B1
(45) Date of Patent: Apr. 22, 2008

(54) BANDWIDTH TUNABLE SIGMA-DELTA ADC MODULATOR

(75) Inventor: Hung-Chuan Pai, Irvine, CA (US)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 0 days.

(21) Appl. No.: 11/626,854

(22) Filed: Jan. 25, 2007

(51) Int. Cl.
*H03M 3/00* (2006.01)

(52) U.S. Cl. ............................. 341/143; 341/155

(58) Field of Classification Search ............... 341/143, 341/118, 120, 131, 155
See application file for complete search history.

(56) References Cited

U.S. PATENT DOCUMENTS

| | | | |
|---|---|---|---|
| 5,243,345 A | 9/1993 | Naus et al. | |
| 7,034,725 B2 * | 4/2006 | Gandolfi et al. | 341/143 |
| 7,042,375 B1 * | 5/2006 | van Engelen | 341/131 |
| 7,221,302 B1 * | 5/2007 | Melanson | 341/143 |

OTHER PUBLICATIONS

Eric J. Van Der Zwan, "FP13.7: A2.3mW CMOS ΣΔ Modulator for Audio Applications," ISSCC97/Session 13/Oversampling Data Converters/Paper FP 13.7, IEEE International Solid-State Circuits Conference, Digest of Technical Papers, Feb. 1997, pp. 220-221 &461.

Eric J. Van Der Zwan, et al., "A 10.7-MHz IF-to-Baseband ΣΔ A/D Conversion System for AM/FM Radio Receivers", IEEE Journal of Solid-State Circuits, Dec. 2000, vol. 35, No. 12, pp. 1810-1819.
Kirk C.-H. Chao, et al., "A Higher Order Topology for Interpolative Modulators for Oversampling A/D Converters", IEEE Transactions on Circuits and Systems, vol. 37, No. 3, Mar. 1990, pp. 309-318.
Sasan H. Ardalan, et al., "An Analysis of Nonlinear Behavior in Delta-Sigma Modulators", IEEE Trans. On Circuits and Systems, vol. CAS-34, No. 6, Jun. 1987, pp. 593-603.
"Common-Mode Feedback", Operational Amplifiers, pp. 320-321, (Aug. 1992).
Robert H.M. Van Veldhoven, "A Trip-Mode Continous-Time ΣΔ Modulator With Switched-Capacitor Feedback DAC for a GSM-Edge/CDMA2000/UMTS Receiver", IEEE Journal of Solid State Circuits, vol. 38, No. 12, Dec. 2003, pp. 2069-2076.

* cited by examiner

*Primary Examiner*—Brian Young
(74) *Attorney, Agent, or Firm*—Winston Hsu

(57) ABSTRACT

A high order continuous-time Sigma-Delta Modulator (ΣΔM) is used for its high carrier-to-noise ratio (CNR) performance and low power consumption. The modulator is designed to allow zero-IF, wide-band low-pass or low-IF flexibility. The sigma-delta ADC modulator includes a receiving circuit, a plurality of loop filter transconductors, a plurality of feedforward weighting amplifiers, a first adding element, at least a local feedback circuit, a quantizer, and a feedback DAC. The local feedback circuit includes a feedback weighting amplifier and a second adding element. The feedback coefficient of the feedback weighting amplifier is tunable, and the local feedback circuits can be designed to maximize bandwidth combination.

7 Claims, 17 Drawing Sheets

BANDWIDTH TUNABLE SIGMA-DELTA ADC MODULATOR

BACKGROUND OF INVENTION

1. Field of the Invention

The present invention relates to an analog-to-digital modulator, especially to a bandwidth tunable sigma-delta ADC modulator.

2. Description of the Prior Art

The analog-to-digital converter (ADC) has been gradually moving toward front end in modern wireless communication receivers to exchange analog selectivity with digital process FIG. 1 shows conventional receiver architecture; the received signal is processed by the SAW filter 110, low-noise amplified by the LNA 120, and then mixed down by the mixer 130. Channel selection filter 140 and programmable gain amplifier (PGA) 150 follow to filter out-of-band interferers and adjust the in-band signal strength. The signal is then converted to digital domain by the ADC 160 for baseband demodulation performed by the digital demodulator 170. There involve several analog-processing stages those introduce process variation and offset. Extra supporting circuitry is needed for calibration and controlling signal strength; it therefore increases the system complexity, risk, and time-to-market.

FIG. 2 demonstrates digitized receiver architecture by moving ADC 160 toward the antenna. Signal processing such as scaling and filtering is combined with signal demodulation in digital domain, and these functions are performed by the digital processor 180, thereby obtaining system optimization, stability and even programmability for multi-standard operation. The burden of this approach falls on the ADC 160 that has to possess high linearity, dynamic range, bandwidth, and low power consumption.

A continuous-time (CT) sigma-delta modulator ($\Sigma\Delta M$) ADC is well suitable for this application for its low power consumption and insensitive to process variation. A discrete-time (switched-capacitor, SC) $\Sigma\Delta M$ ADC is popular for its accurate loop filter coefficient control by good capacitor matching. Nevertheless, the SC $\Sigma\Delta M$ needs an anti-alias filter before the signal sampled by the loop filter. In addition, the bandwidth of the filter opamp's has to be several times of the sampling frequency and therefore consuming lots of power. A CT $\Sigma\Delta M$ with feedforward weighting amplifiers, on the other hand, has the sampling happened at the end of the loop filter; the loop filter itself additionally serves as an anti-alias filter. Moreover, only the first stage of the loop filter needs larger bandwidth and high gain while the rest stages error are suppressed by the first stage. Therefore, a low power $\Sigma\Delta M$ ADC is achievable.

Please refer to FIG. 3. FIG. 3 shows a CT $\Sigma\Delta M$ ADC with feedforward weighting amplifiers. The CT $\Sigma\Delta M$ ADC 300 includes an adder 310, a loop filter 320, a quantizer 340, and a DAC 350. The loop filter 320 includes a plurality n of transconductors, including the first stage transconductor 322 and other stage transconductors 324, and an adder 328. Each transconductor is coupled to a corresponding feedforward weighting amplifier 326. The input terminal of the feedforward weighting amplifier 326 is coupled to the output of the corresponding transconductor, and the output terminal of the feedforward weighting amplifier 326 is coupled to the adder 328. The single-loop structure shown in FIG. 3 is adopted for its simple stability and easy bandwidth modification. The analog input signal is represented by X and the digital output signal is denoted by Y. The quantizer 340 can be implemented by a one-bit quantizer used for better linearity. The quantizer 340 is modeled as a gain stage 342 (gain=k) plus additive noise (N) through an adder 344. The quantizer gain k, changing dynamically, is related to X.

The loop filter of the $\Sigma\Delta M$ will be realized by Gm-C structure; the individual unit gain bandwidth is annotated as $W_1 \sim W_n$ with feedforward coefficient $a_1 \sim a_n$. The DAC 350 is connected between the output Y and the adder 310 for providing a feedback signal to the input signal X.

There exists stability issue for a $\Sigma\Delta M$ design. The stability problem for this single-loop structure is released because once the internal signal becomes large, the later loop filter stage ($n^{th}$, then $(n-1)^{th}$ and then $(n-2)^{th}$) will saturate sequentially and provide no AC gain to the quantizer 340. The system will reduce to a $2^{nd}$ order $\Sigma\Delta M$ temporarily and maintain its stability. In addition, it is advisory to shape the noise spectrum as smooth as possible to reduce high frequency disturbance for stability enhancement; a good choice is to design the noise-transfer-function (NTF) as a high-pass Butterworth filter. The loop filter transfer function can be derived as $$\frac{B(S)}{A(S)} = \frac{\begin{array}{c} k(a_1 W_1 S^{n-1} + a_2 W_1 W_2 S^{n-2} + \ldots + \\ a_{n-1}(W_1 \cdot W_2 \ldots W_{n-2} \cdot W_{n-1})S + \\ a_n(W_1 \cdot W_2 a_{n-1}(W_1 \cdot W_2 \ldots W_{n-1} \cdot W_n))\end{array}}{S^n} \quad (1)$$

The STE (signal-transfer-function) and NTF of the system can then be represented as $$STF: \frac{Y(S)}{X(S)} = \frac{B(S)}{A(S) + B(S)} \quad (2)$$

$$NTF: \frac{Y(S)}{N(S)} = \frac{A(S)}{A(S) + B(S)} \quad (3)$$

The unit-gain bandwidth $W_1 \sim W_n$ are chosen depending on application but $W_2 \sim W_n$ can be smaller than $W_1$ because the later stage errors are all suppressed by the first stage. For simplicity, a five-stage loop filter ADC is taken as an example to explain the poles and zeros. For initial guess and discussion purpose, the quantizer gain k is assumed to be 1. By placing the NTF poles on the left-hand plane Butterworth positions, FIG. 4 demonstrates the NTF pole and zero locations in S-plane, and FIG. 5 shows the corresponding frequency response.

The quantizer gain k, however, changes dynamically. Once the system unit gain bandwidth and feedforward coefficients of the feedforward weighting amplifiers are decided, the variation of k may cause the stability issue to the system FIG. 6 demonstrates the NTF pole movement while k increases from 1, and FIG. 7 demonstrates the NTF pole movement while k decreases from 1. Note that the k change has no affect on the zeros and the NTF poles are also STF poles as mentioned in (2) and (3).

For a large k, the NTF can be approximated as A(S)/B(S); in FIG. 6, four NTF poles approach the zeros of STF and one goes to $-\infty$ on real axis and causes no stability issue. On the other hand, while k decreases from 1, some poles may go to right hand plane ($k<k_{crit}$, which is 0.48 here as an exemplary example) and cause system unstable. Fortunately, the decrease of k happens at the situation of large internal signal; the later stages of the loop filter will be saturated (or limited by the natural of the circuit property, e.g., clamped by the power supply) sequentially. The overall loop filter stage is effectively reduced such that the stability range extends.

SUMMARY OF INVENTION

It is therefore a primary objective of the claimed invention to provide bandwidth tunable sigma-delta ADC modulator.

According to an embodiment of the claimed invention, a sigma-delta ADC modulator is disclosed. The sigma-delta ADC modulator includes a receiving circuit, a plurality N of loop filter transconductors, a plurality N of feedforward weighting amplifiers, a first adding element, at least an adjustable local feedback circuit, a quantizer, and a feedback DAC. The receiving circuit receives an input signal and a feedback signal and generates a first difference signal corresponding to the difference of the input signal and the feedback signal. The first stage of the loop filter transconductor is coupled to the receiving circuit. The plurality N of feedforward weighting amplifiers generates weighted signals. The feedforward weighting amplifier of rank q is coupled to the corresponding loop filter transconductor of rank q, where q ranges from 1 to N. The first adding element, which is coupled to the N feedforward weighting amplifiers, receives weighted signals and generates a filtered signal. The adjustable local feedback circuit includes a feedback weighting amplifier and a second adding element. The feedback weighting amplifier, which has an adjustable feedback coefficient, is coupled to the loop filter transconductor of rank m+1, for receiving an output signal of the loop filter transconductors of rank m+1 and generating a local feedback signal, where m ranges from 2 to N−1. The a second adding element, which is coupled between loop filter transconductors of rank m−1 and m, generates a second difference signal corresponding to the difference between an output signal of the loop filter transconductor of rank m−1 and the local feedback signal. The quantizer, which is coupled to the first adding element, quantizes the filtered signal and generating a digital output signal. The feedback DAC, which is coupled to the quantizer and the receiving circuit, generates the feedback signal according to the digital output signal. The sigma-delta ADC modulator is characterized in that the bandwidth of the sigma-delta ADC modulator can be tuned by changing the feedback coefficient of the feedback weighting amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciates electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
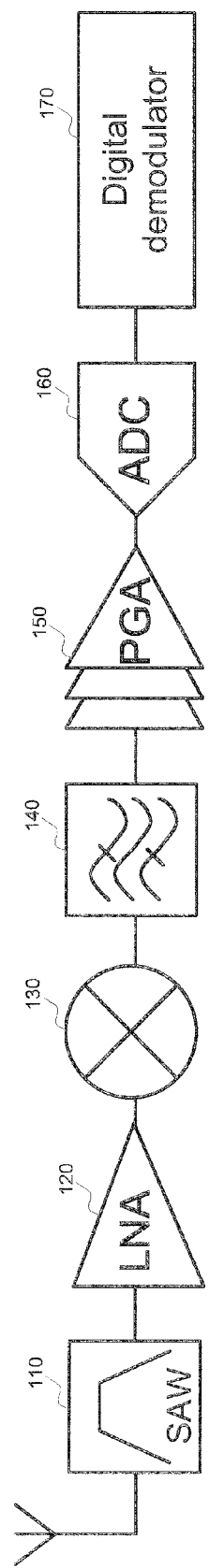
FIG. 1 shows conventional wireless receiver architecture.
Figure 2:
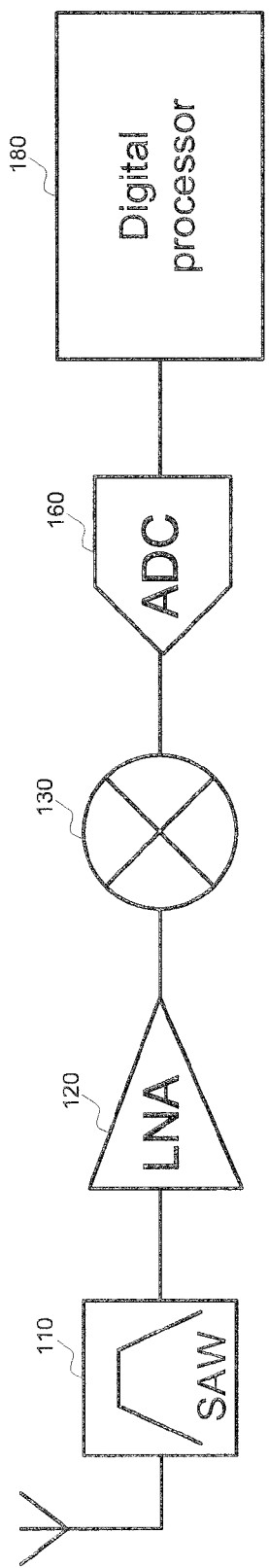
FIG. 2 demonstrates digitized receiver architecture by moving ADC toward the antenna.
Figure 3:
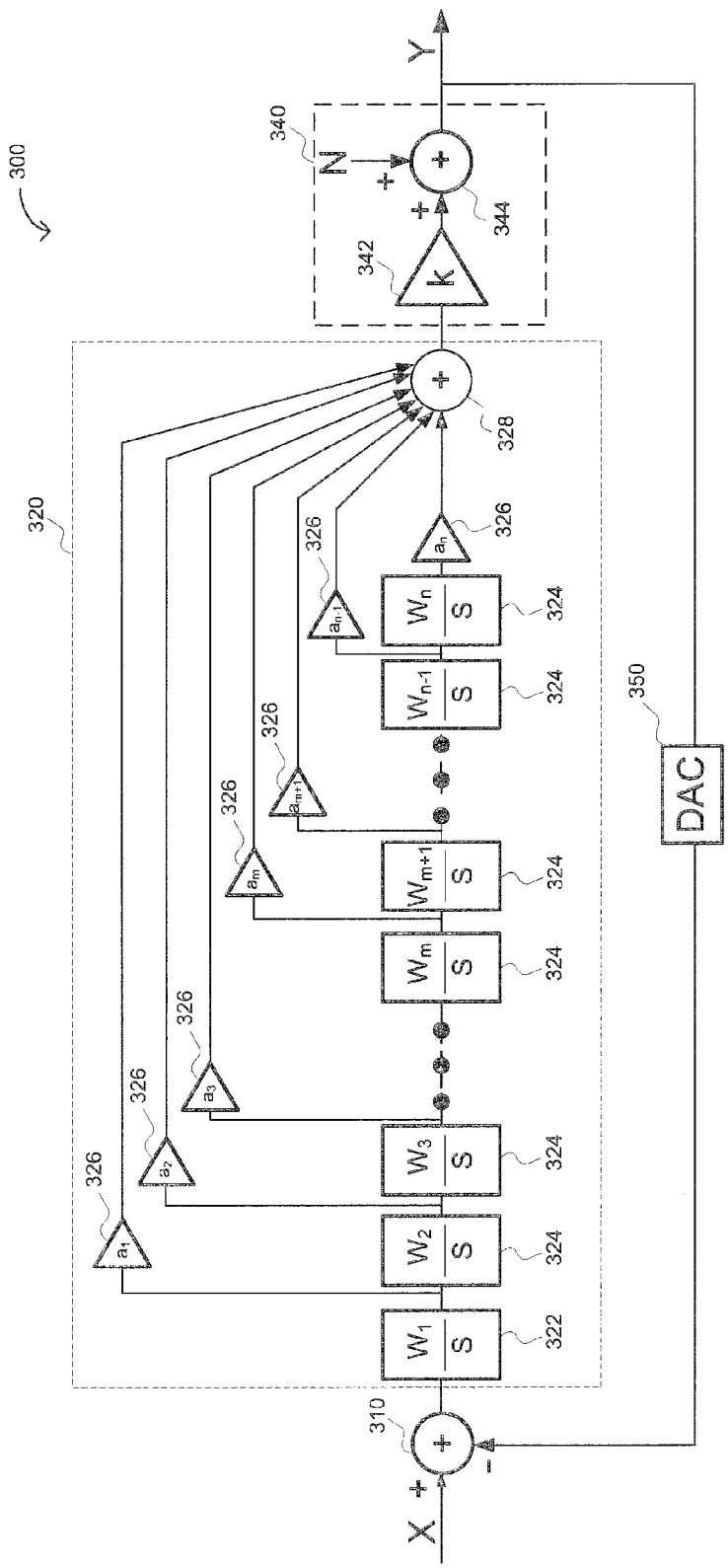
FIG. 3 shows a CT ΣΔM ADC with feedforward weighting amplifiers.
Figure 4:
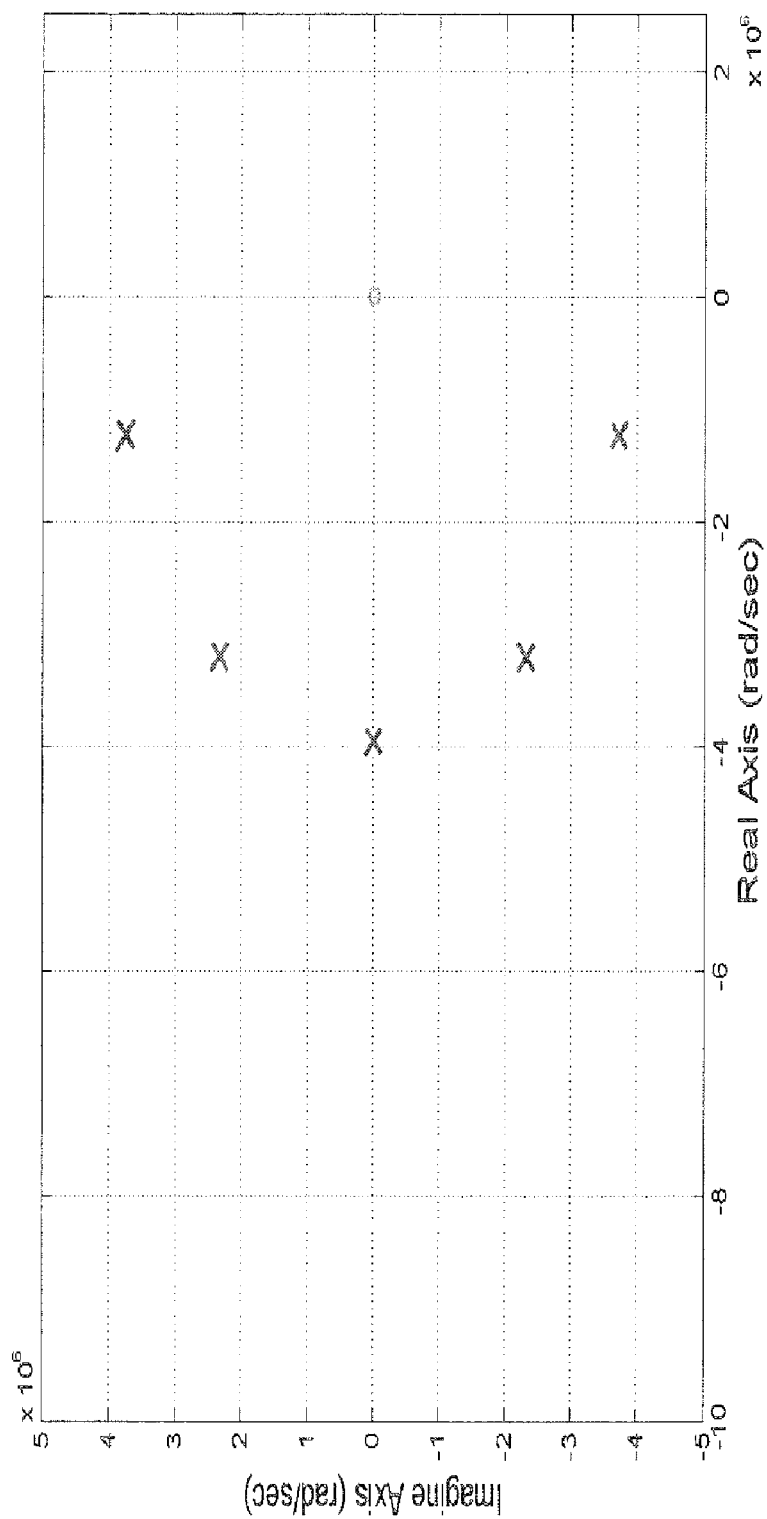
FIG. 4 demonstrates the NTF pole and zero locations in S-plane.
Figure 5:
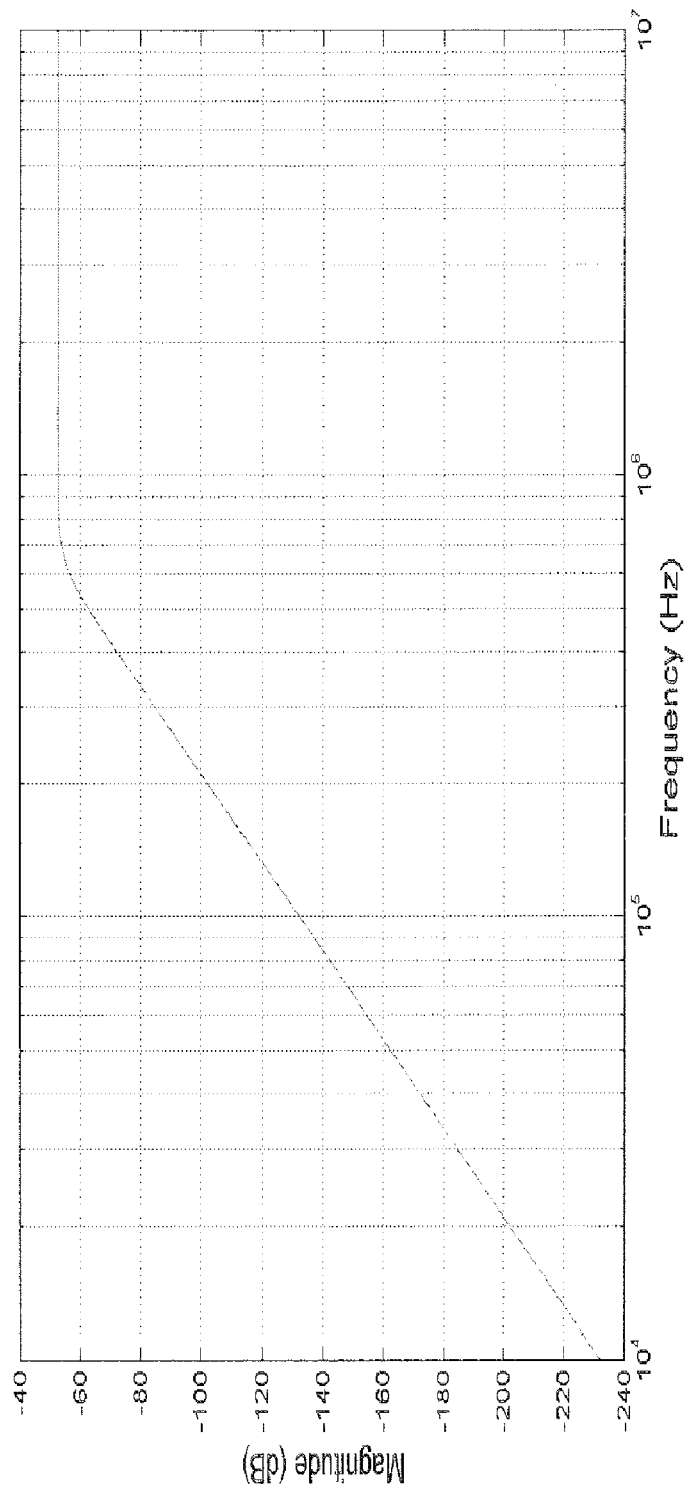
FIG. 5 shows the corresponding frequency response of FIG. 4.
Figure 6:
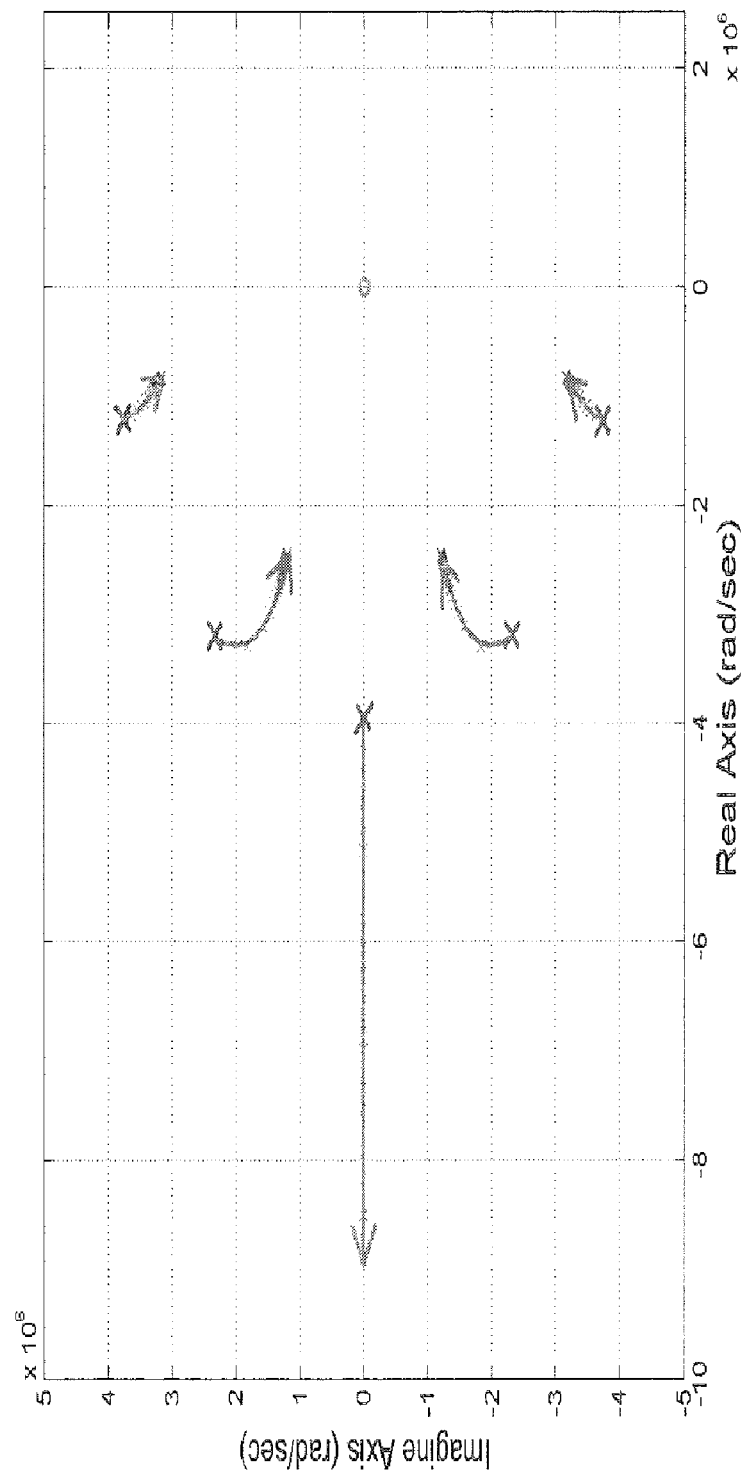
FIG. 6 demonstrates the NTF pole movement while k increases from 1.
Figure 7:
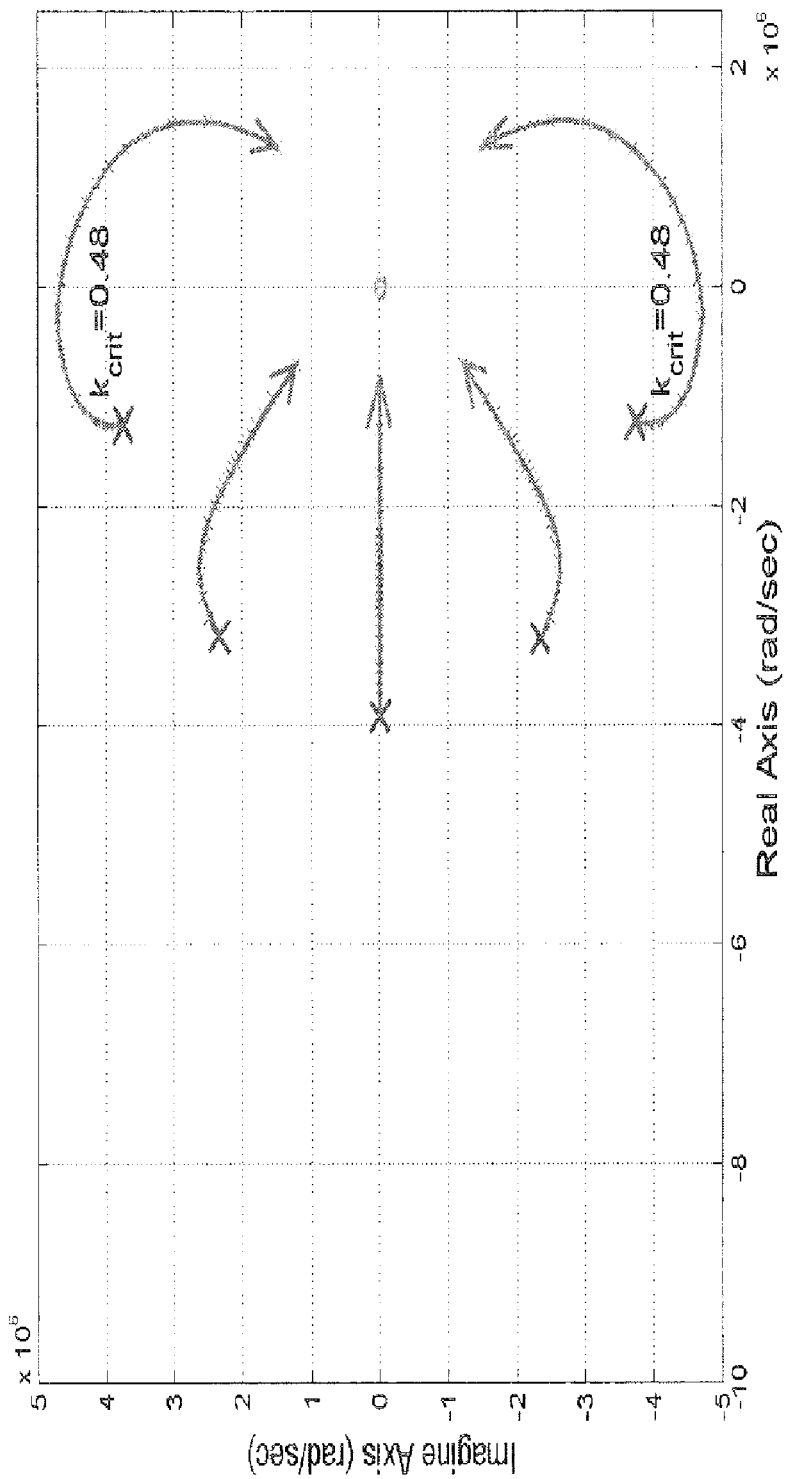
FIG. 7 demonstrates the NTF pole movement while k decreases from 1.
Figure 8:
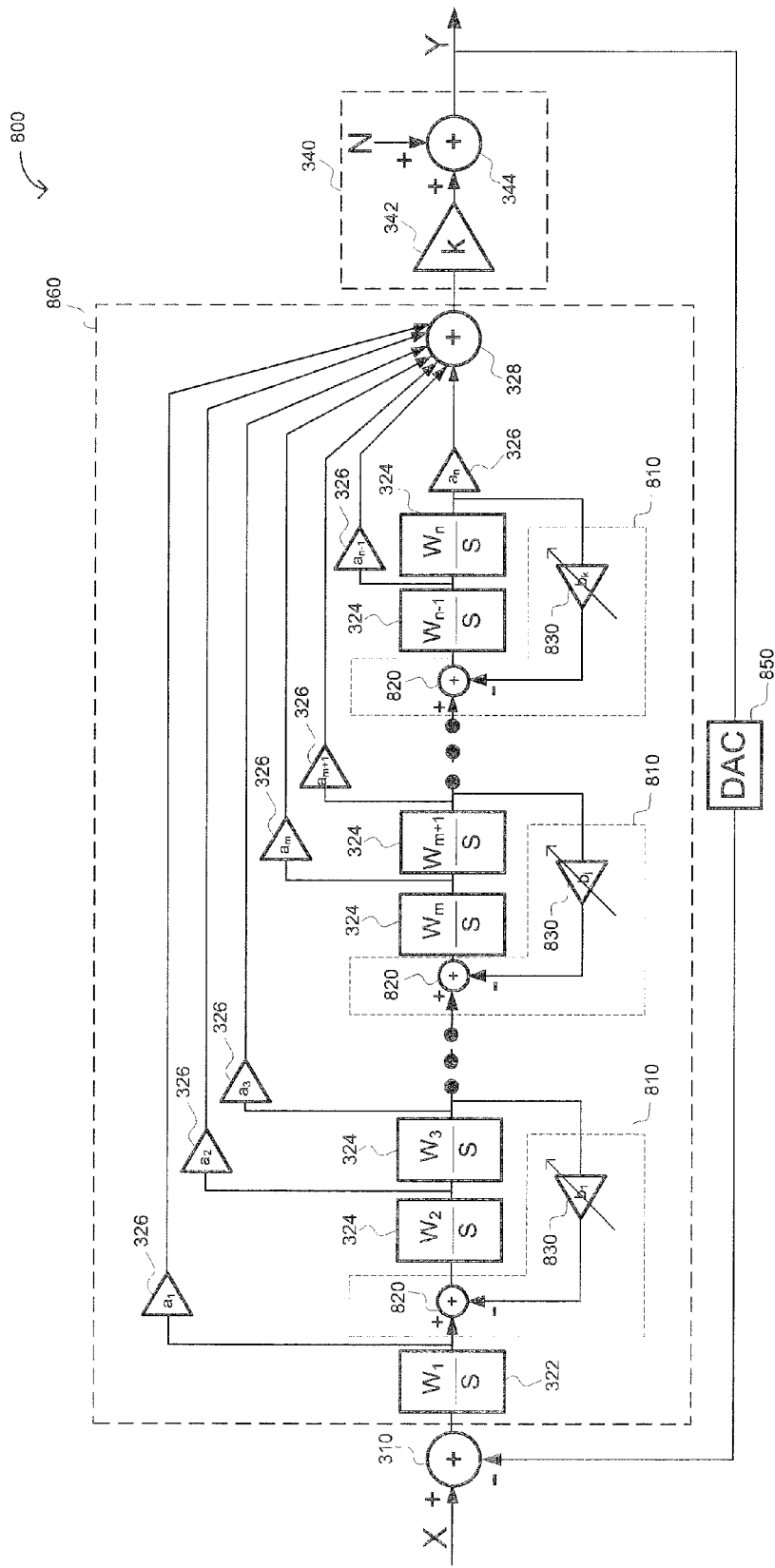
FIG. 8 shows a CT ΣΔM ADC with feedforward weighting amplifiers and local feedback weighting amplifiers.

Nowadays, a system containing multi-standards gives most cost-effective solution. It is useful if the ΣΔM ADC bandwidth is switchable among zero-IF, wide-band low-pass or low-IF characteristics. This goal can be achieved by adding local feedback circuits to the ΣΔM loop filter. Please refer to FIG. 8. FIG. 8 shows a CT ΣΔM ADC with feedforward weighting amplifiers and local feedback weighting amplifiers. The elements designated by the same number as those elements shown in FIG. 3 have the same functions. For brevity, descriptions of the same elements are omitted. In FIG. 8, the CT ΣΔM ADC 800 has a plurality of local feedback circuits 810 included in the loop filter 860. Each local feedback circuit 810 includes an adder 820 and a feedback weighting amplifier 830. Generally, a feedback weighting amplifier 830 has its input coupled to the output of a transconductor of stage m+1, and its output coupled to the adder 820 which is coupled between the transconductors of stages m−1 and m, where m ranges from 2 to n−1. The feedback weighting amplifier 830 generates a local feedback signal to the adder 820, and the adder 820 generates a difference signal corresponding to the difference between an output signal of the loop filter transconductor of rank m−1 and the local feedback signal.

Figure 9:
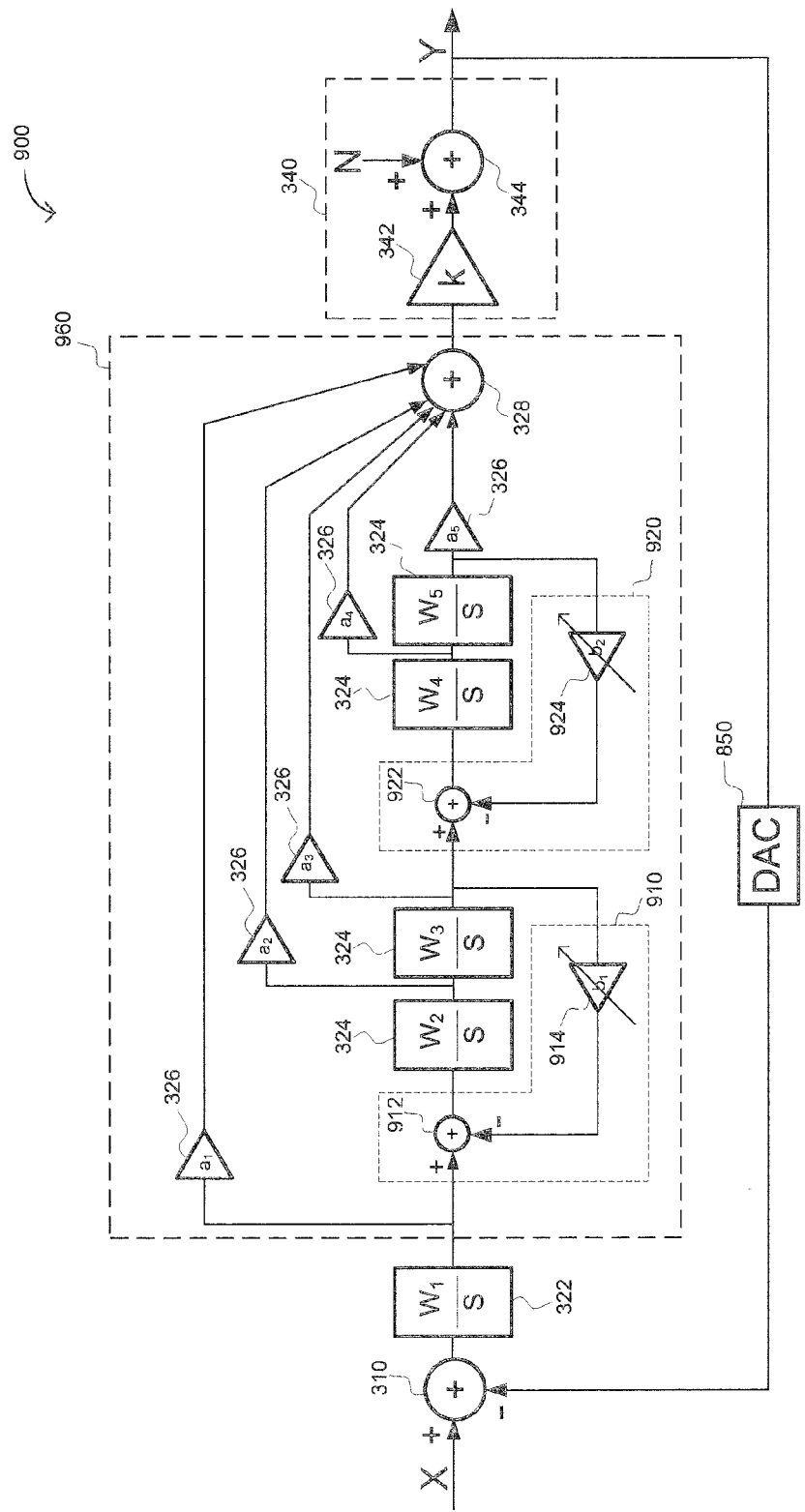
FIG. 9 shows a five-stage loop filter ADC with local feedback circuits.
Figure 10:
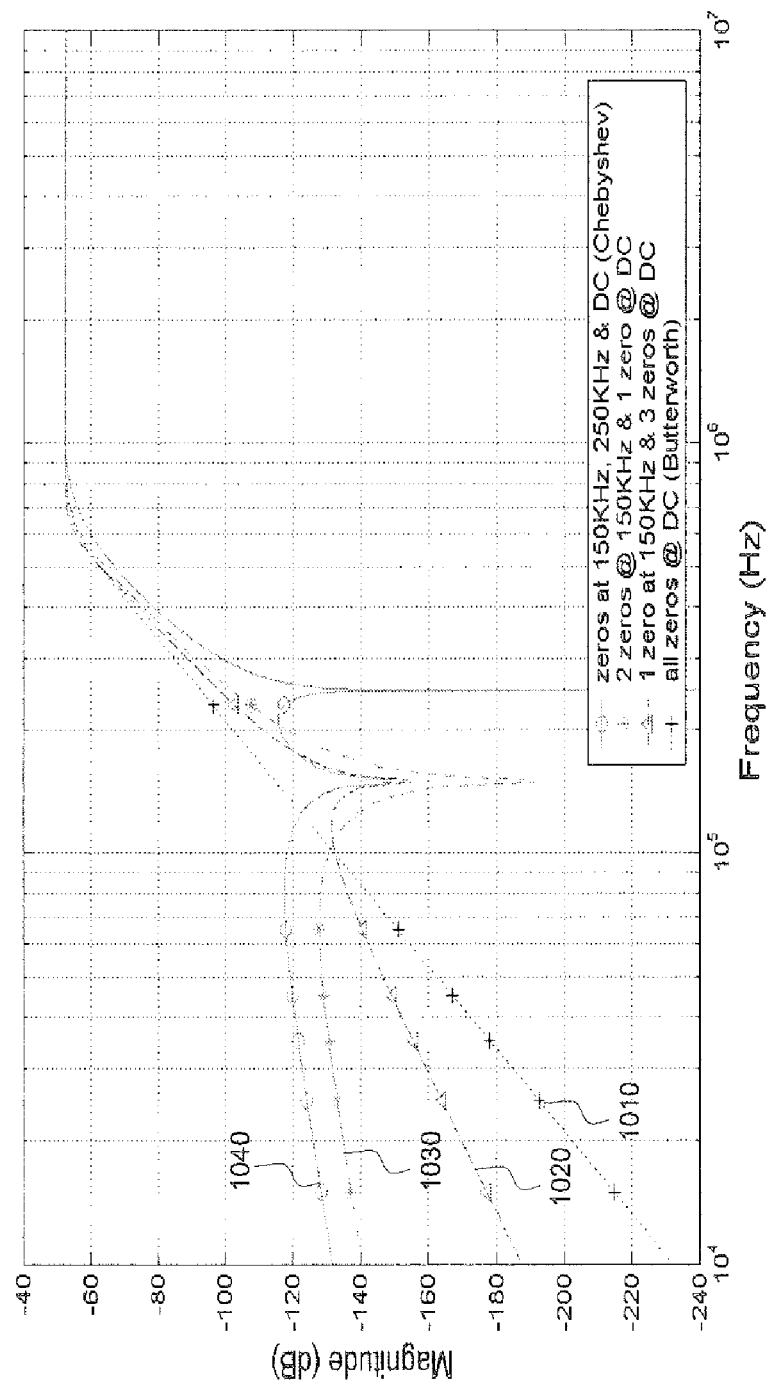
FIG. 10 shows the frequency response of tunable NTF.

Again, for simplicity, a five-stage loop filter ADC with local feedback circuits, as shown in FIG. 9, is taken as an example to explain the features. In FIG. 9, the CT ΣΔM ADC 900 has two local feedback circuits 910 and 920 in the loop filter 960 which respectively attached to stages 2, 3 and stages 4, 5. The feedback weighting amplifier 914 of the local feedback circuit 910, whose feedback coefficient is b1, has its input coupled to the output of the transconductor of stage 3 and its output coupled to the adder 912; similarly, the feedback weighting amplifier 924 of the local feedback circuits 920, whose coefficient is b2, has its input coupled to the output of the transconductor of stage 5 and its output coupled to the adder 922. By enabling or disabling feedback weighting amplifiers 914 and 924 to have zeros moved away or kept at DC, the flexibility of exchanging bandwidth with low frequency attenuation is obtained. Furthermore, the local feedback circuits 910 and 920 are designed tunable to maximize bandwidth combination. The frequency response of tunable NTF is shown in FIG. 10. FIG. 10 demonstrates four cases: 1). both feedback weighting amplifiers 914 and 924 disabled, indicated by line 1010, 2) feedback weighting amplifier 914 disabled and feedback weighting amplifiers 924 enabled to locate a zero at 150 KHz, indicated by line 1020, 3). both feedback weighting amplifiers 914 and 924 enabled to locate both zeros at 150 KHz, indicated by line 1030, and 4). both feedback weighting amplifiers 914 and 924 enabled but the feedback coefficient b1 for zero at 250 KHz and the feedback coefficient b2 for zero at 150 KHz, indicated by line 1040. Essentially, the case 4), to have both feedback weighting amplifiers 914 and 924 enabled and locate zeros at different frequencies turns the high pass Butterworth NTF into high pass Chebyshev response.

For desired notch frequencies Wb1 and Wb2, the feedback coefficients b1 and b2 can be decided by $$b_1 = (W_{b1})^2/(W_2 \times W_3) \quad (4)$$

$$b_2 = (W_{b2})^2/(W_4 \times W_5) \quad (5)$$

and the loop filter transfer function then becomes $$\frac{B(S)}{A(S)} = \frac{k\{(a_1 W_1 S^4 + a_2 W_1 W_2 S^3 + [a_1 W_1(b_1 W_3 + b_2 W_5) + a_3 W_1 W_2 W_3]S^2 + (a_2 b_2 W_1 W_2 W_5 + a_4 W_1 W_2 W_3 W_4)S + (a_1 b_1 b_2 W_1 W_3 W_5 + a_3 b_2 W_1 W_2 W_3 W_5 + a_5 W_1 W_2 W_3 W_4 W_5)\}}{S^5 + (b_1 W_3 + b_2 W_5)S + b_1 b_2 W_3 W_5 S} \quad (6)$$

The feedback coefficients b1 and b2 are designed tunable to include more notch frequencies. Note that (6) turns back to (1) if b1=b2=0 (disabling both feedback weighting amplifiers 914 and 924).

Figure 11:
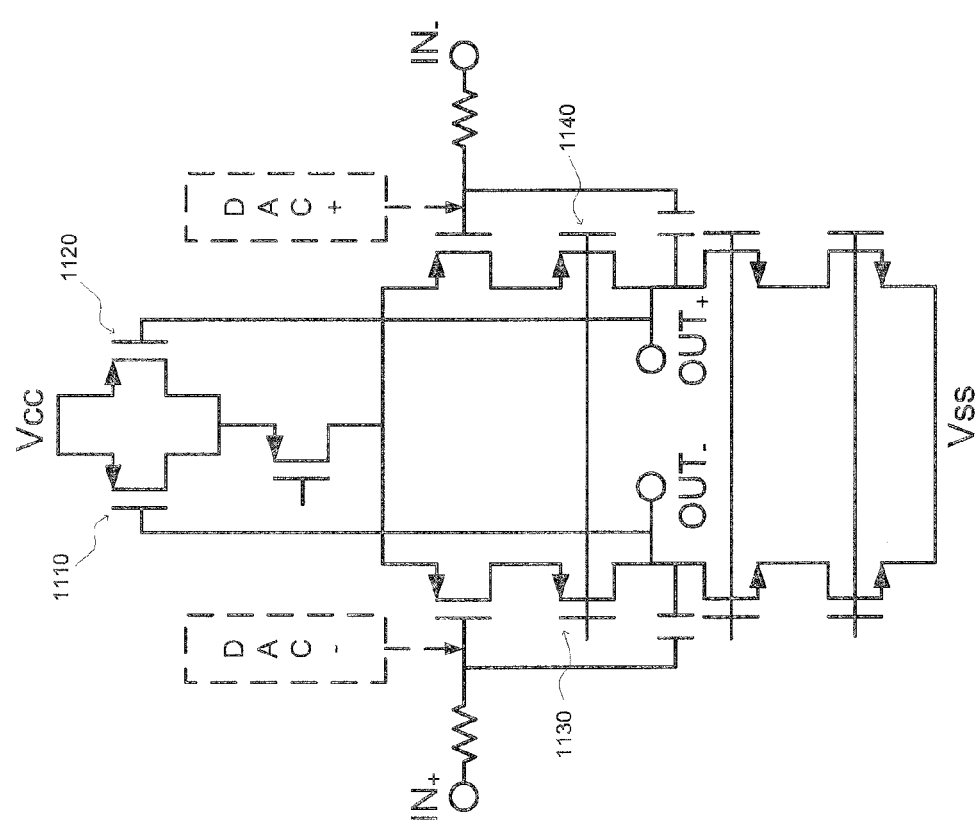
FIG. 11 shows the transconductor of the first stage.
Figure 12:
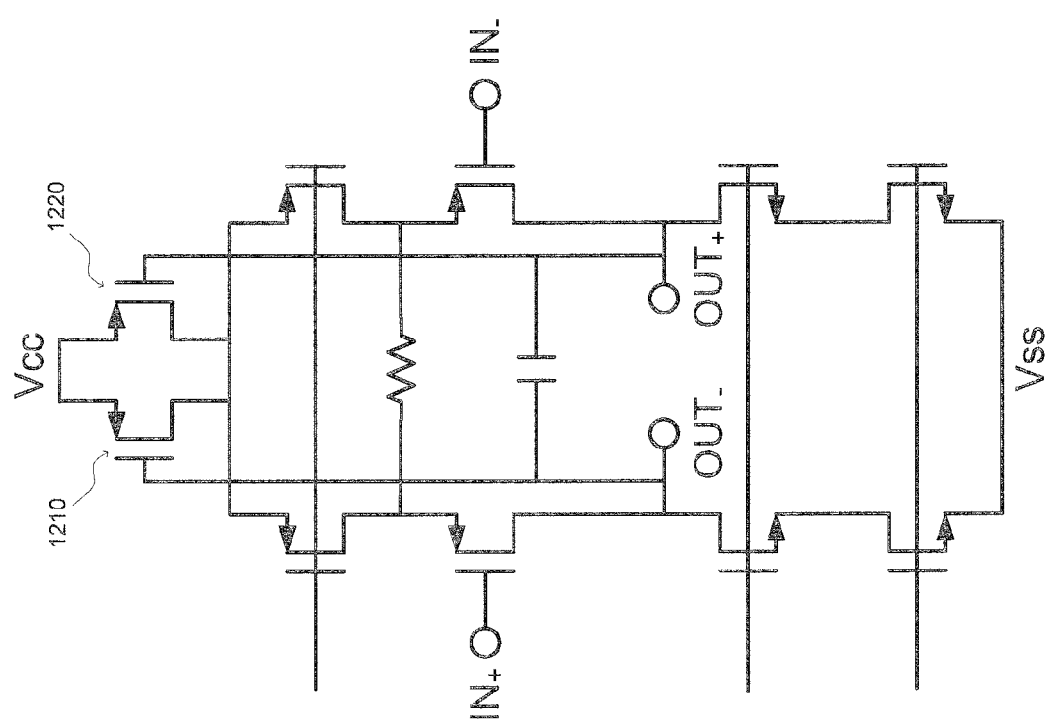
FIG. 12 shows the transconductor of rest stages.
Figure 13:
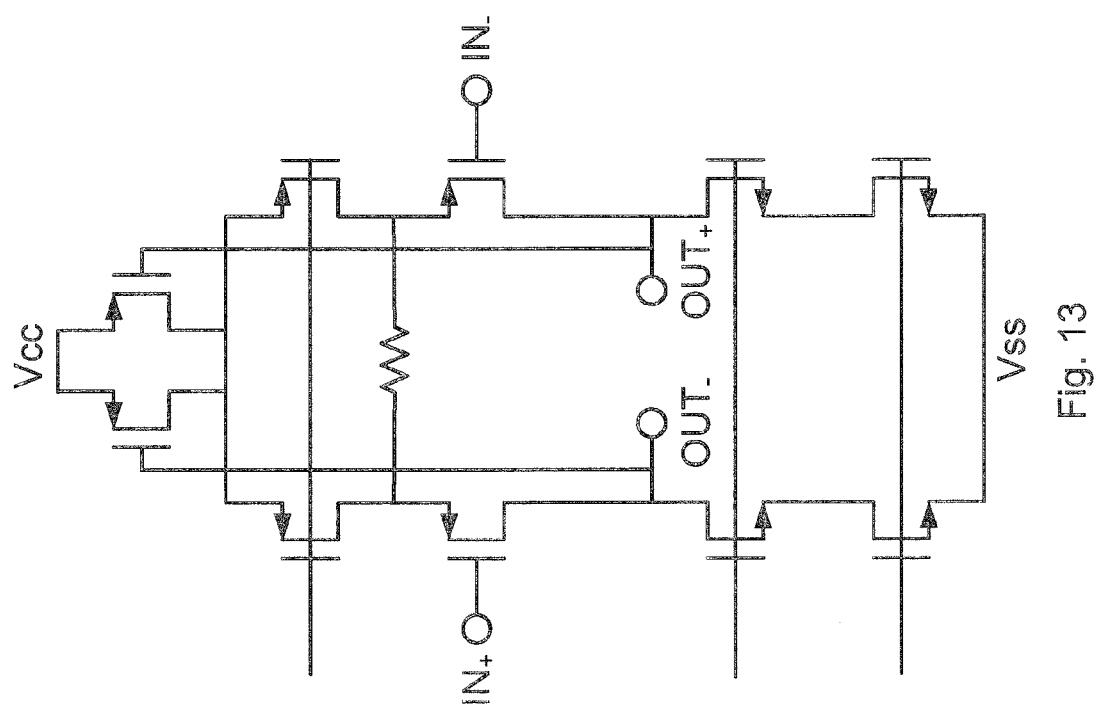
FIG. 13 shows the transconductor for the feedforward weighting amplifiers.
Figure 14:
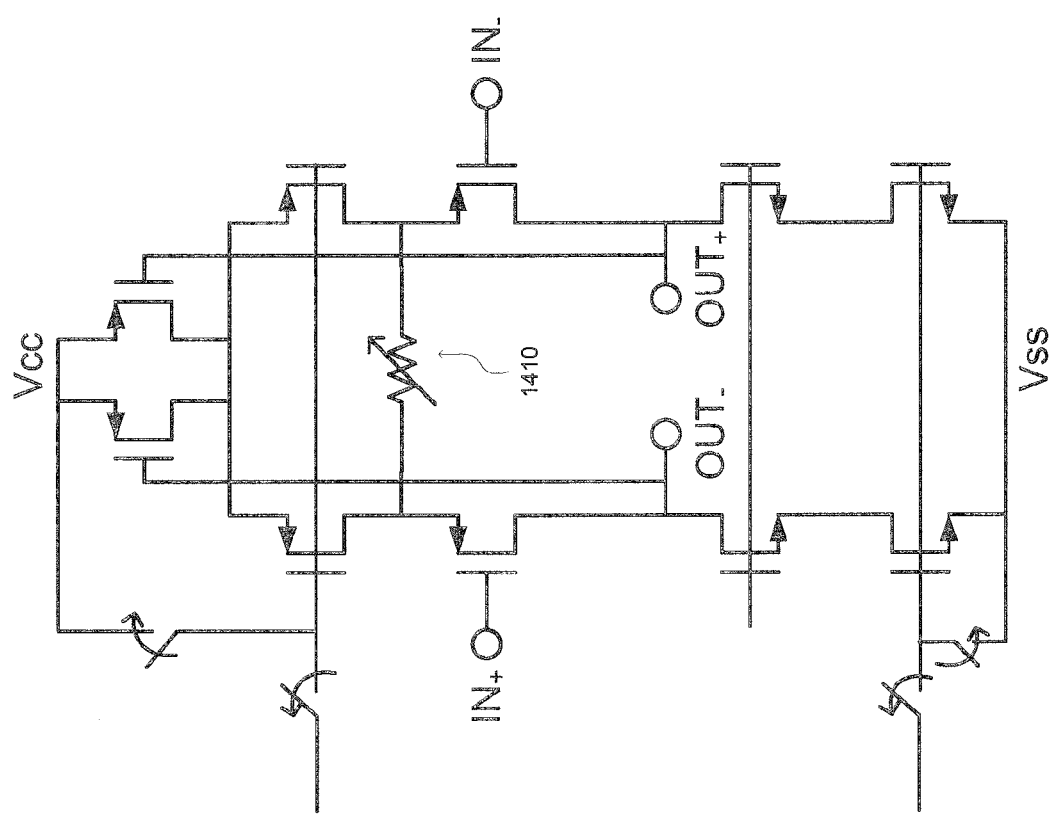
FIG. 14 shows the transconductor for the feedback weighting amplifiers.

FIG. 11 shows the transconductor of the first stage 322 with its differential inputs IN$_+$ and IN$_-$ coupled respectively to the inverted output DAC$_-$ and non-inverted output DAC$_+$ of the DAC 350. FIG. 12 shows the transconductor of rest stages 324. Transistors 1110 and 1120 shown in FIG. 11 and transistors 1210 and 1220 shown in FIG. 12 operate in triode region for adjusting output common mode voltage; cascode transistors 1130 and 1140 in FIG. 11 are to help first stage gain those do not appear in the rest stages to trade off output swing. Similar to the transconductor in FIG. 12, FIG. 13 shows the transconductor for feedforward weighting amplifiers 326 and FIG. 14 is for the feedback weighting amplifiers 830, 914 and 924. Please note that the circuits shown in FIG. 11 through FIG. 14 serve only examples to explain implementation of the present invention, and therefore can not be limitations to the present invention. The feedback weighting amplifier includes a variable resistor 1410. By adjusting the value of the variable resistor 1410, the feedback coefficient can be changed. Extra power-down switches are added to bias voltages in FIG. 14 for controlling zeros; the shown tuning direction is to disable the transconductor or keep zero at DC. In addition, the degeneration resistor is made switchable for different notch frequency possibilities.

Figure 15:
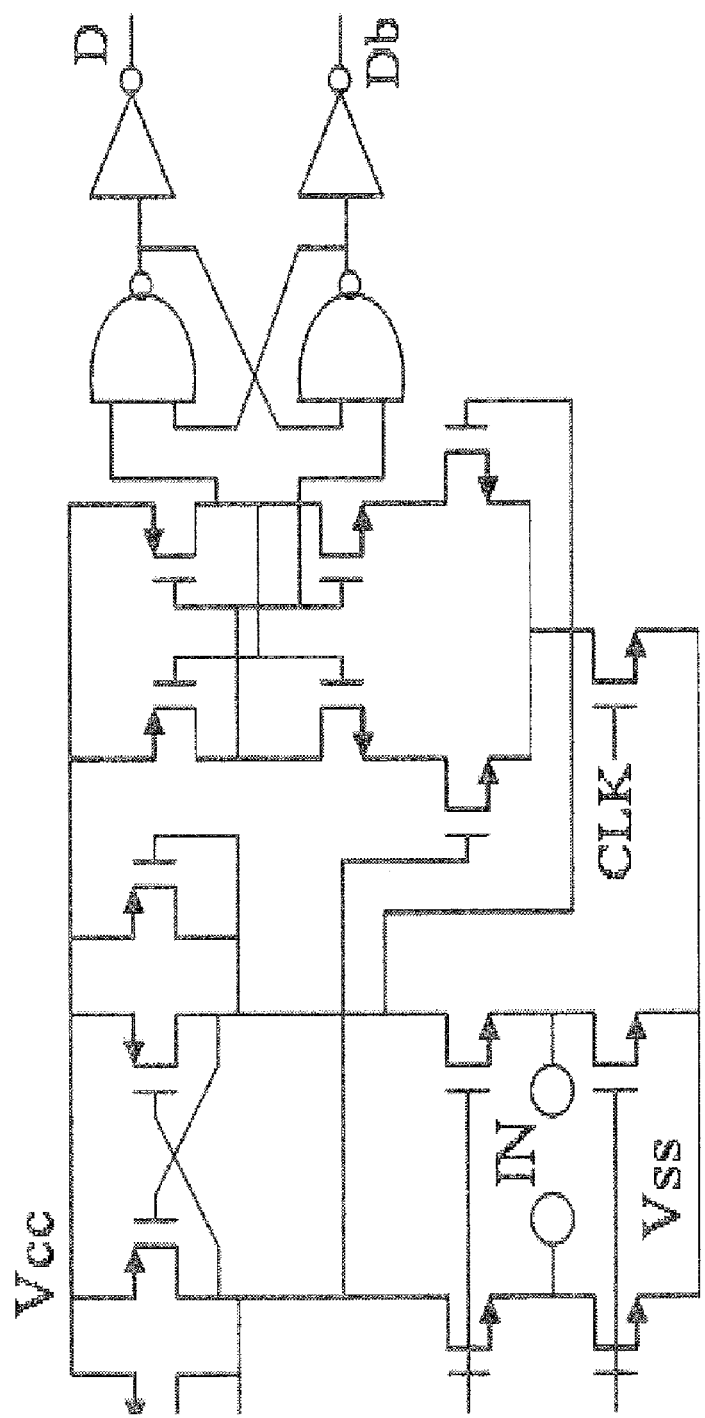
FIG. 15 shows the circuit for the 1-bit quantizer.
Figure 16:
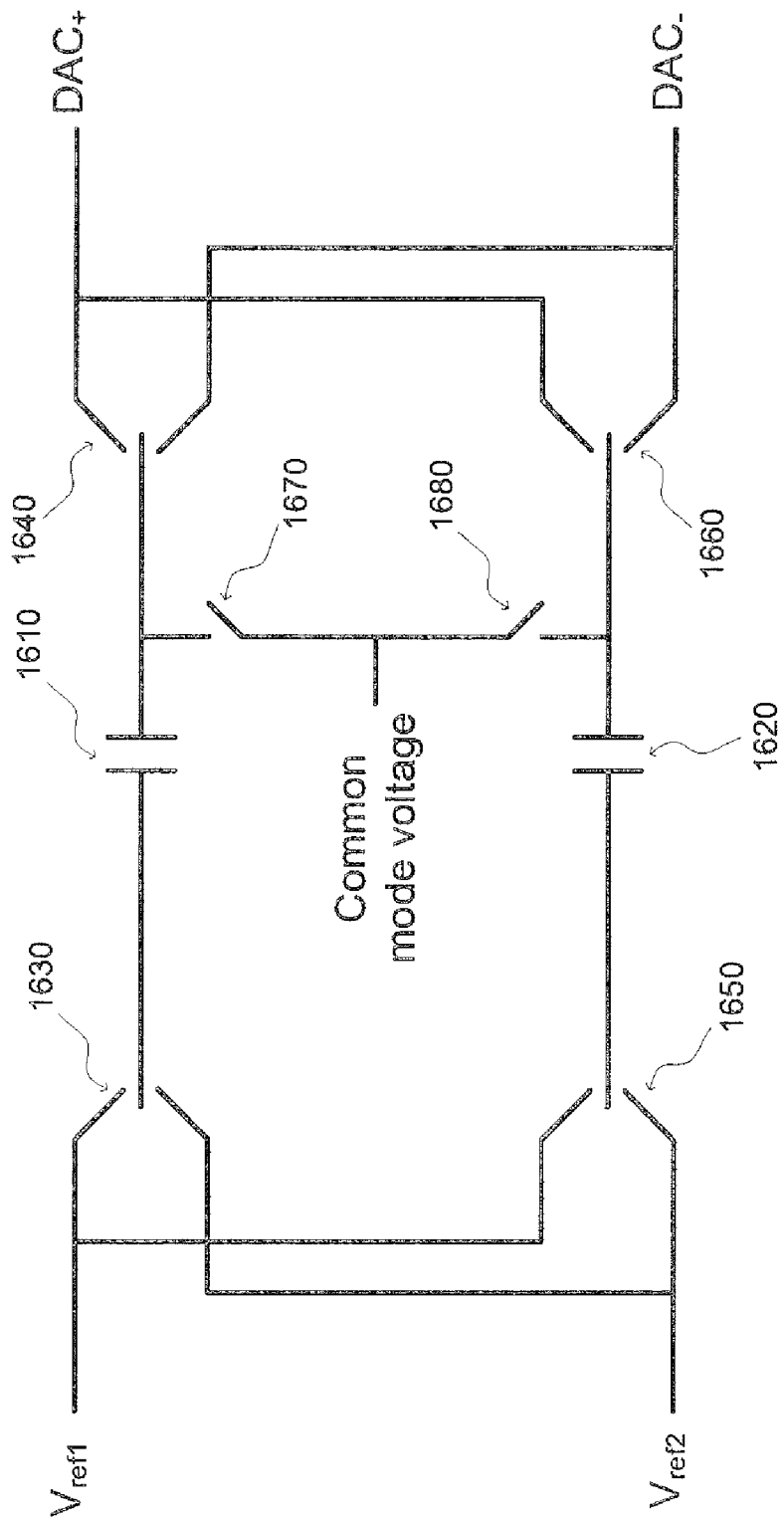
FIG. 16 shows the switched-capacitor DAC.

FIG. 15 shows the circuit for the 1-bit quantizer 340 which contains pre-amp, comparator and a latch. The digital outputs, D and Db are AND gated by CLKb to create Dz and Dzb (return-to-zero). Dz and Dzb are used to re-direct the output of switched-capacitor DAC 350 for feedback as shown in FIG. 16. switched-capacitor DAC 350 includes two capacitors 1610 and 1620, the capacitance of each being adjustable. One terminal of the capacitor 1610 is connected to a switch 1630 for switching between the reference voltages V$_{ref1}$ and V$_{ref2}$; the other terminal of the capacitor 1610 is connected to a switch 1640 for switching between the two output terminals DAC$_+$ and DAC$_-$. Similarly, one terminal of the capacitor 1620 is connected to a switch 1650 for switching between the reference voltages V$_{ref1}$ and V$_{ref2}$; the other terminal of the capacitor 1620 is connected to a switch 1660 for switching between the two output terminals DAC$_+$ and DAC$_-$. There are further switches 1670 and 1680 for respectively connecting capacitors 1610 and 1620 to the common mode voltage. The ΣΔM ADC input common mode voltage can be set to be 0.9V and reference voltages V$_{ref1}$ and V$_{ref2}$, which are adjustable, can be set to be 1.4V and 0.4V respectively. The return-to-zero timing in DAC is for better immunity from symbol interference.

Figure 17:
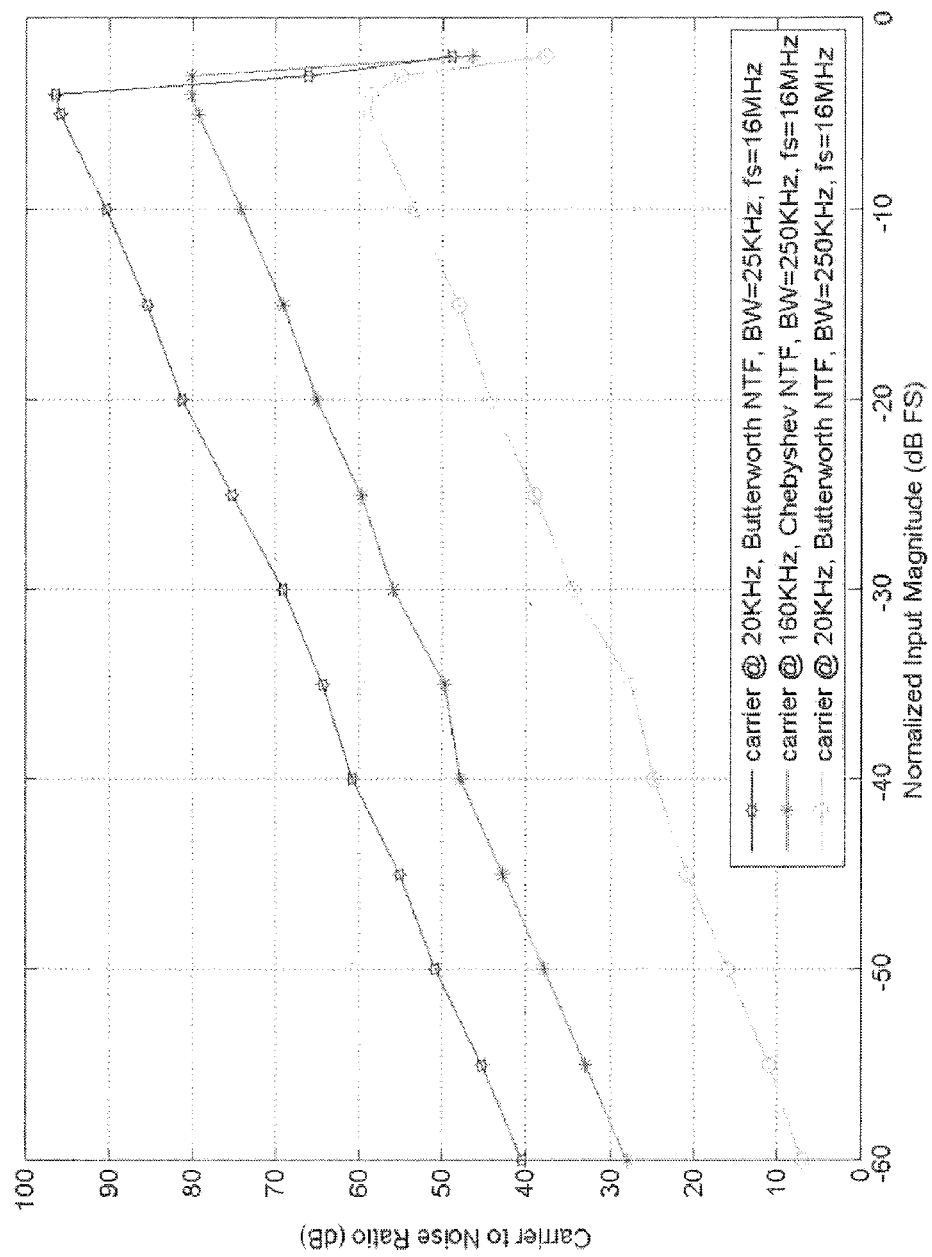
FIG. 17 demonstrates the performance and the advantage of tunable bandwidth.

FIG. 17 demonstrates the performance and the advantage of tunable bandwidth. For a frequency band of 0~25 KHz, carrier of 20 KHz and sampling frequency of 16 MHz, the Butterworth NTF (both local feedbacks off) reaches CNR of 96 dB but only 59 dB if integrating 0~250 KHz band. On the other hand, Chebyshev NTF (both local feedbacks on) reaches CNR of 80 dB for frequency band of 0~250 KHz and carrier at 160 KHz using the same sampling frequency. The modulator consumes 2 mA from a single 1.8V power supply.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sigma-delta ADC modulator, comprising
   a receiving circuit for receiving an input signal and a feedback signal and generating a first difference signal corresponding to the difference of the input signal and the feedback signal;
   a plurality N of loop filter transconductors of rank q, with the loop filter transconductor of rank 1 coupled to the receiving circuit, where q ranges from 1 to N;
   a plurality N of feedforward weighting amplifiers for generating weighted signals, the feedforward weighting amplifier of rank q being coupled to the corresponding loop filter transconductor of rank q;
   a first adding element, coupled to the N feedforward weighting amplifiers, for receiving weighted signals and generating a filtered signal;
   at least an adjustable local feedback circuit, comprising:
      a feedback weighting amplifier which can be disabled and has an adjustable feedback coefficient, coupled to the loop filter transconductor of rank m+1, for receiving an output signal of the loop filter transconductors of rank m+1 and generating a local feedback signal, where m ranges from 2 to N−1; and
      a second adding element, coupled between loop filter transconductors of rank m−1 and m, for generating a second difference signal corresponding to the difference between an output signal of the loop filter transconductor of rank m−1 and the local feedback signal;

a quantizer, coupled to the first adding element, for quantizing the filtered signal and generating a digital output signal; and a feedback DAC, coupled to the quantizer and the receiving circuit, for generating the feedback signal according to the digital output signal;

characterized in that the bandwidth of the sigma-delta ADC modulator can be tuned by changing the feedback coefficient of the feedback weighting amplifier.

2. The sigma-delta ADC modulator of claim 1, wherein the feedback weighting amplifier comprises a variable resistor.

3. The sigma-delta ADC modulator of claim 2, wherein the feedback coefficient of the feedback weighting amplifier can be adjusted by changing the value of the variable resistor.

4. The sigma-delta ADC modulator of claim 1, wherein the receiving circuit is implemented by an adder.

5. The sigma-delta ADC modulator of claim 1, wherein the feedback DAC is a switched-capacitor type DAC with a least a capacitor connected to a reference voltage.

6. The sigma-delta ADC modulator of claim 5, wherein the capacitance of the capacitor is adjustable.

7. The sigma-delta ADC modulator of claim 5, wherein the reference voltage is adjustable.

\* \* \* \* \*